(12) United States Patent
Huster et al.

(10) Patent No.: US 6,531,347 B1
(45) Date of Patent: Mar. 11, 2003

(54) METHOD OF MAKING RECESSED SOURCE DRAINS TO REDUCE FRINGING CAPACITANCE

(75) Inventors: Carl R. Huster, Sunnyvale, CA (US); Judy An, San Jose, CA (US); Richard P. Rouse, San Francisco, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/776,713

(22) Filed: Feb. 6, 2001

Related U.S. Application Data
(60) Provisional application No. 60/181,086, filed on Feb. 8, 2000.

(51) Int. Cl.[7] .............................................. H01L 21/84
(52) U.S. Cl. .................... 438/164; 438/163; 438/300; 438/301
(58) Field of Search ................... 257/412, 288, 257/192, 368, 372, 382–384, 280–284; 438/151, 163, 184, 655–6, 233, 229, 595, 300, 197, 299, 592, 301, 164, 230, 585, 589, 201–3, 193

(56) References Cited

U.S. PATENT DOCUMENTS

| | | | |
|---|---|---|---|
| 5,073,519 A | 12/1991 | Rodder | |
| 5,087,581 A | 2/1992 | Rodder | |
| 5,121,176 A | 6/1992 | Quigg | |
| 5,291,050 A | 3/1994 | Nishimura | |
| 5,508,539 A | * 4/1996 | Gilbert et al. | 257/280 |
| 2001/0014533 A1 | * 8/2001 | Sun | 438/655 |

* cited by examiner

Primary Examiner—Wael Fahmy
Assistant Examiner—Thanh Pham

(57) ABSTRACT

The capacitance between the gate electrode and the source/drain regions of a semiconductor device is reduced by forming source and drain regions that are recessed a prescribed depth below the main surface of the semiconductor substrate. Sidewall spacers and a silicide layer are subsequently formed on the gate electrode stack. The resulting semiconductor device exhibits reduced capacitance between the gate electrode and the source/drain regions, while maintaining circuit reliability.

9 Claims, 6 Drawing Sheets

METHOD OF MAKING RECESSED SOURCE DRAINS TO REDUCE FRINGING CAPACITANCE

This application claims the benefit of provisional application No. 60/181,086, filed Feb. 8, 2000.

TECHNICAL FIELD

The present invention relates to semiconductor devices. and, more particularly, to semiconductor devices having reduced fringing capacitance between the gate electrode and the source/drain regions.

BACKGROUND ART

The requirements for high density performance associated with ultra large scale integration semiconductor devices continue to escalate, thus requiring design features of 0.18 micron and under (e.g., 0.15 micron and under), increased transistor and circuit speeds, high reliability, and increased manufacturing throughput for competitiveness. The reduction of design features to 0.18 micron and under challenges the limitations of conventional semiconductor manufacturing techniques. Moreover, as design features are reduced into the deep sub-micron range, it becomes increasingly difficult to maintain or improve manufacturing throughput for competitiveness.

Conventional semiconductor devices typically comprise a semiconductor substrate, normally doped monocrystalline silicon, and a plurality of interleaved dielectric and conductive layers formed thereon. In a conventional semiconductor device 300, as illustrated in FIG. 3, a p-type substrate 1 is provided with field oxide 2 for isolating an active region comprising N+ source/drain regions 3, and a gate electrode 4, typically of doped polysilicon, above the semiconductor substrate with gate oxide 5 therebetween. Interlayer dielectric 6, typically silicon dioxide, is then deposited thereover and openings formed by conventional photolithographic and etching techniques. The openings are filled with conductive material to establish electrical contact between a subsequently deposited conductive layer 8, typically aluminum or an aluminum-base alloy, and source/drain regions 3 through contacts 7, and to gate electrode 4. Interlayer dielectric layer 9, typically silicon dioxide, is deposited on conductive layer 8, and another conductive layer 10, typically aluminum or an aluminum-base alloy, is formed on dielectric layer 9 and electrically connected to conductive layer 8 through vias 11.

With continued reference to FIG. 3, conductive layer 10 is the uppermost conductive layer and, hence, constitutes the wire bonding layer. Dielectric layer 12, also typically silicon dioxide, is deposited, and a protective dielectric scratch resistant topside layer 13 deposited thereon. Protective dielectric layer 13 typically comprises a nitride layer, such as silicon nitride. Alternatively, protective dielectric layer 13 may comprise a dual topcoat comprising a nitride layer on an oxide layer. The protective dielectric layer 13 provides scratch protection to the semiconductor device 300 and protection against moisture and impurity contamination during subsequent processing. After deposition of protective dielectric layer 13, conventional photolithographic etching techniques are employed to form an opening to expose wire bonding layer 10 for external connection by means of bonding pad 14 and electrically conductive wires 15 or an external connection electrode (not shown).

Although only two conductive layers 8 and 10 are depicted in FIG. 3 for illustrative convenience, conventional semiconductor devices are not so limited and may comprise more than two conductive layers, depending on design requirements, e.g. five conductive metal layers. Also in the interest of illustrative convenience, FIG. 3 does not illustrate any particular type of plug or barrier layer technology. However, such technology is conventional and, therefore, the details of such features are not set forth herein.

As device features continually shrink in size, various circuit parameters become increasingly important. For example, the capacitance between gate electrode 4 and source/drain regions 3 (i.e., fringing capacitance) is an important parameter that affects circuit operating speeds. Generally, when the transistor is under operating conditions, the voltage on gate electrode 4 changes according to the circuit conditions. This requires charging and discharging the gate electrode 4. Accordingly, any capacitance between gate electrode 4 and source/drain regions 3 slows the charging and discharging, and hence, slows the circuit operating speed.

In conventional semiconductor methodology illustrated in FIG. 4A, after polysilicon gate electrode 4 is formed, ion implantation is conducted, as indicated by arrows 20, to form shallow source/drain (S/D) extensions 22. Subsequent to the formation of the S/D extensions 22, a layer of dielectric material, such as silicon dioxide or silicon nitride is deposited and etched to form insulating sidewall spacers 24 on the side surfaces of gate electrode 4, as shown in FIG. 4B. Adverting to FIG. 4B, ion implantation is then conducted, as indicated by arrows 30, to form moderately-doped source/drain (MDD) or heavily-doped source/drain (HDD) implants 32.

An approach to reducing the fringing capacitance is to increase the distance between the gate electrode 4 and source/drain regions 3. Conventional methodology achieves this goal by increasing the thickness of sidewall spacers 24. This method, however, is not always beneficial because the fringing capacitance will only be decreased if the sidewall spacers 24 are formed prior to implantation. Further, increasing the thickness of sidewall spacers 24 requires additional real estate, which is at a premium in devices having design features of 0.18 micron and under.

A further drawback attendant upon the formation of conventional sidewall spacers 24 is that the material used to form the spacers typically has a relatively high dielectric constant (K), e.g., about 3.9 (oxide) to about 7.0 (nitride). These high-K materials increase the capacitance between gate electrode 4 and S/D extensions 22, thereby slowing circuit operating speeds. It is not practical to employ materials having a low-K to form sidewall spacers, since typical low-K materials are not robust enough to shield shallow S/D extensions 22 from the subsequent impurity implantations forming MDD/HDD implants 32. Further, typical low-K materials are not robust enough to prevent subsequent silicide formations from shorting the gate electrode to the source/drain regions. In high performance integrated circuits, such as those employed in microprocessors, capacitive loading must be reduced to as great an extent as possible to avoid reductions in circuit speed, without sacrificing circuit reliability.

Accordingly, there exists a need for semiconductor devices and a method of manufacturing semiconductor devices exhibiting current high performance and reduced capacitive loading between the gate electrode and source/drain regions (i.e., fringing capacitance) and sidewall spacers having a reduced thickness

SUMMARY OF THE INVENTION

An advantage of the present invention is a semiconductor device that exhibits reduced capacitance between the gate electrode and source/drain regions.

Another advantage of the present invention is a semiconductor device having reduced thickness sidewall spacers compared to conventional methodologies.

These and other advantages are achieved by the present invention, wherein a semiconductor device includes recessed source and drain regions that function to reduce capacitance between the gate electrode and source/drain regions, thereby reducing fringing capacitance.

An aspect of the invention is a semiconductor device comprising a semiconductor substrate having a top surface upon which a gate electrode stack is formed. The gate electrode stack includes an upper surface and side surfaces. Doped source/drain regions are recessed into the semiconductor substrate at a first depth that is lower than the main top surface of the semiconductor substrate. The semiconductor device also includes a silicide layer that is formed on the source and drain regions.

The use of recessed source/drain regions provides improved reduction in the fringing capacitance of the semiconductor device. In addition, the thickness of the sidewall spacers need not be increased, as in conventional methodologies, to achieve similar reductions. Accordingly, the size of the semiconductor device the size of the semiconductor device will not necessarily increase because the thickness of the sidewall spacers can remain the same, or even reduced.

Another aspect of the present invention is a method of forming a semiconductor device the method comprising: forming a gate electrode stack on a main surface of a semiconductor substrate, the gate electrode stack having a top surface and side surfaces; forming doped source/drain regions that are recessed into the semiconductor substrate at a first depth that is lower than the main surface of the semiconductor substrate; and forming a refractory layer on the gate electrode stack and the source/drain regions. By forming the source and drain regions at a depth that is lower than the main surface of the semiconductor substrate, fringing capacitance is reduced and performance is increased without sacrificing real estate or reliability.

Additional advantages and novel features of the present invention will be set forth in part in the description which follows, and in part will become apparent to those skilled in the art upon examination of the following, or may be learned by practice of the present invention. The embodiments shown and described provide an illustration of the best mode contemplated for carrying out the present invention. The invention is capable of modifications in various obvious respects, all without departing from the spirit and scope thereof. Accordingly, the drawings and description are to be regarded as illustrative in nature, and not as restrictive. The advantages of the present invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

DETAILED DESCRIPTION OF ILLUSTRATED EMBODIMENTS

The present invention enables the manufacture semiconductor devices that exhibit reduced fringing capacitance between the gate and the source/drain regions. Hence, devices having increased circuit speeds can be manufactured. Further, the present invention achieves these results without sacrificing the size of the semiconductor device. Specifically, this is achieved without the need to increase the size of the sidewall spacers on the gate electrode stack. In fact, certain embodiments of the present invention allow for substantially identical results in performance using sidewall spacers of reduced sizes compared to current methodologies.

Figure 1:
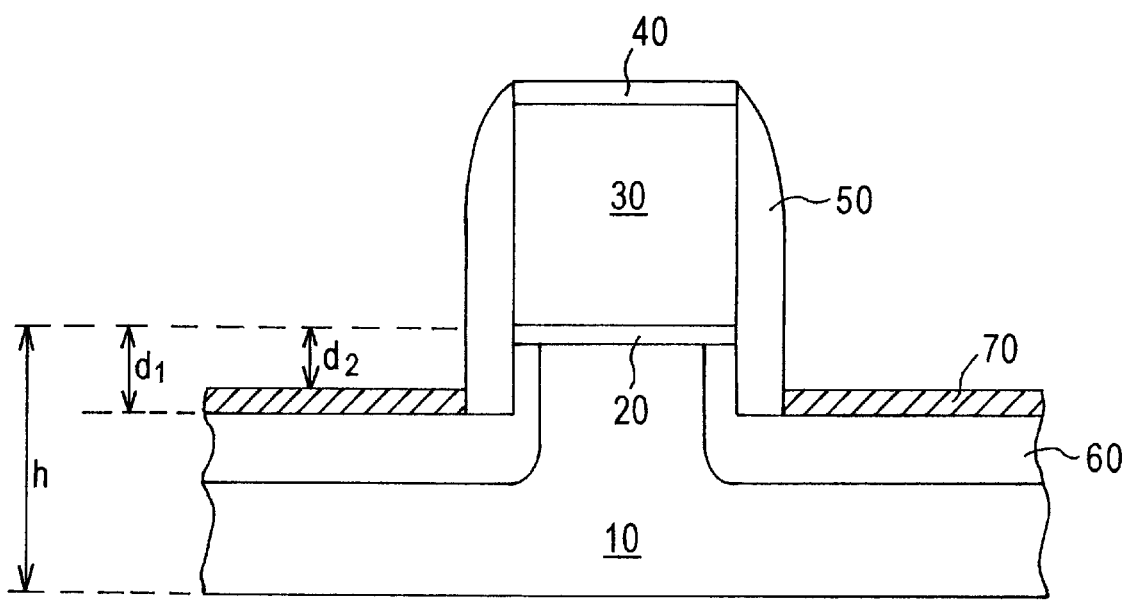
FIG. 1 schematically illustrates a cross-section of a semiconductor device constructed in accordance with an embodiment of the present invention.
Figure 2A:
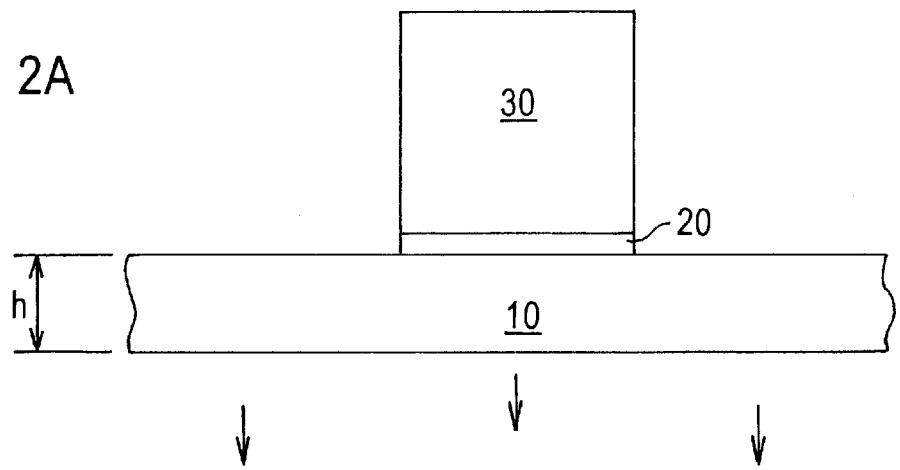
FIGS. 2A–2F illustratively represent sequential stages in a method of manufacturing a semiconductor device in accordance with an embodiment of the present invention.
Figure 2B:
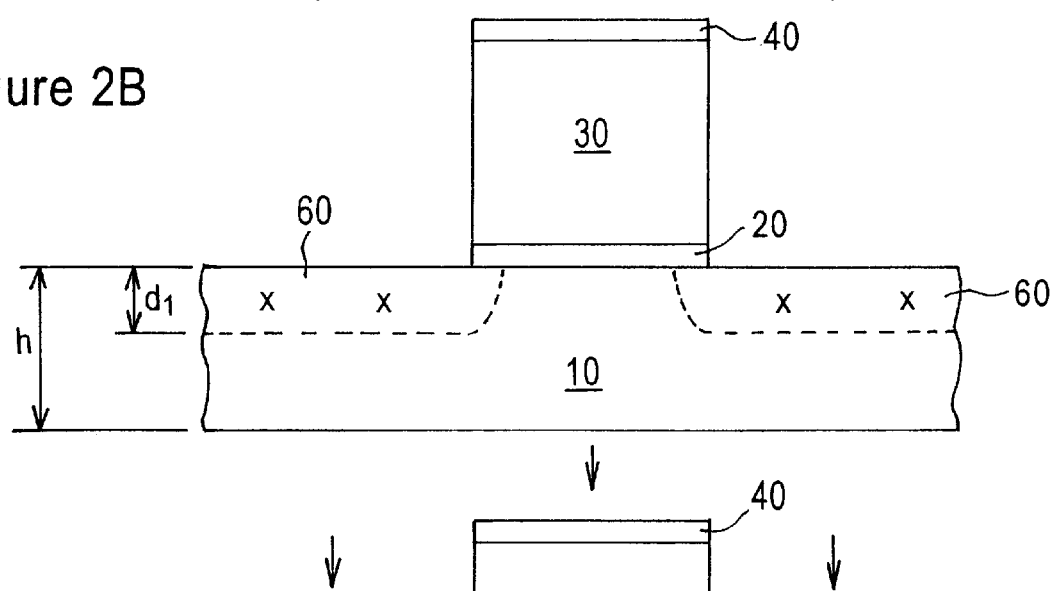
Figure 2C:
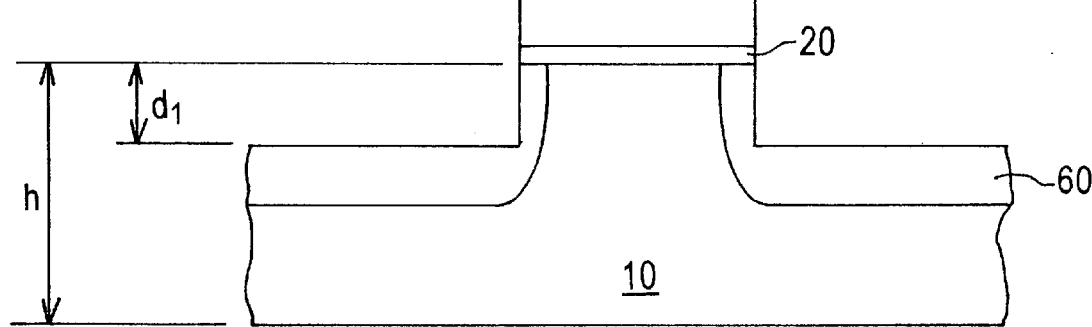
Figure 2D:
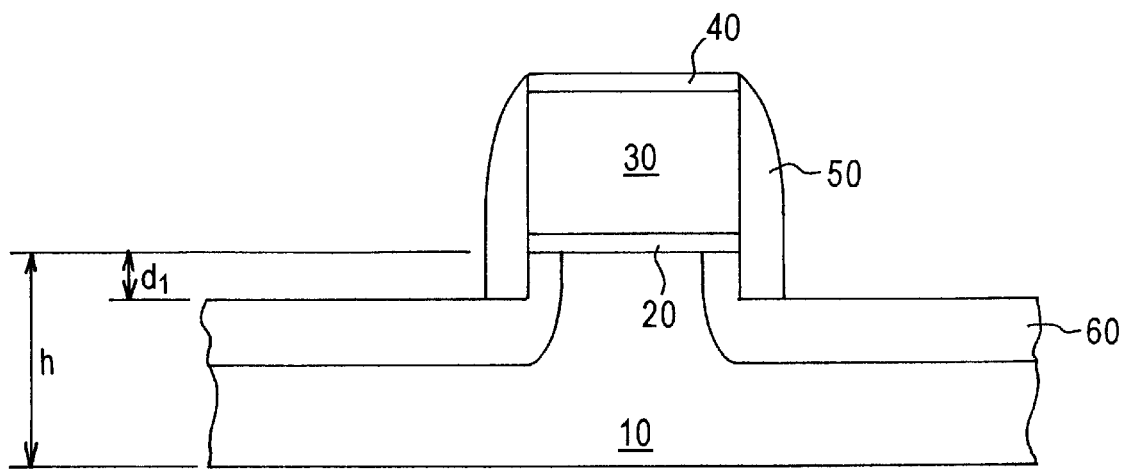
Figure 2E:
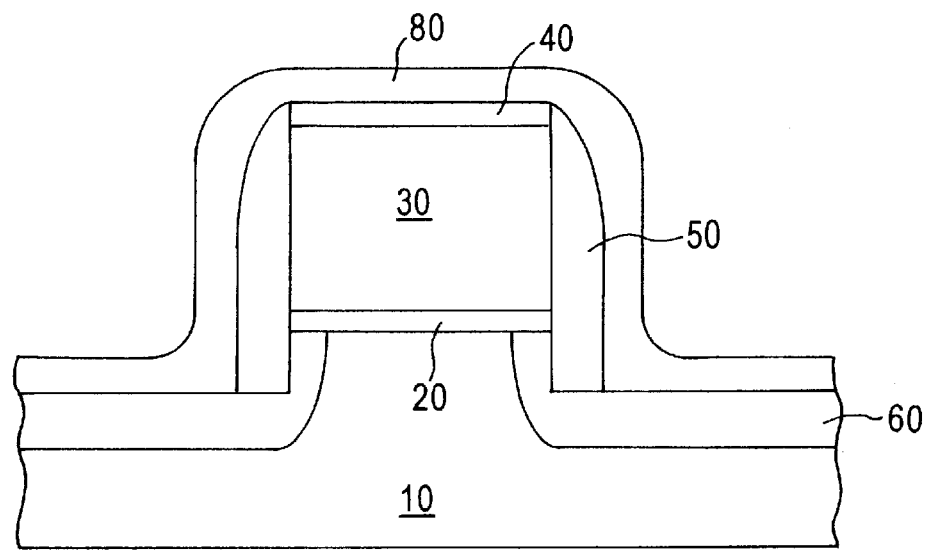
Figure 2F:
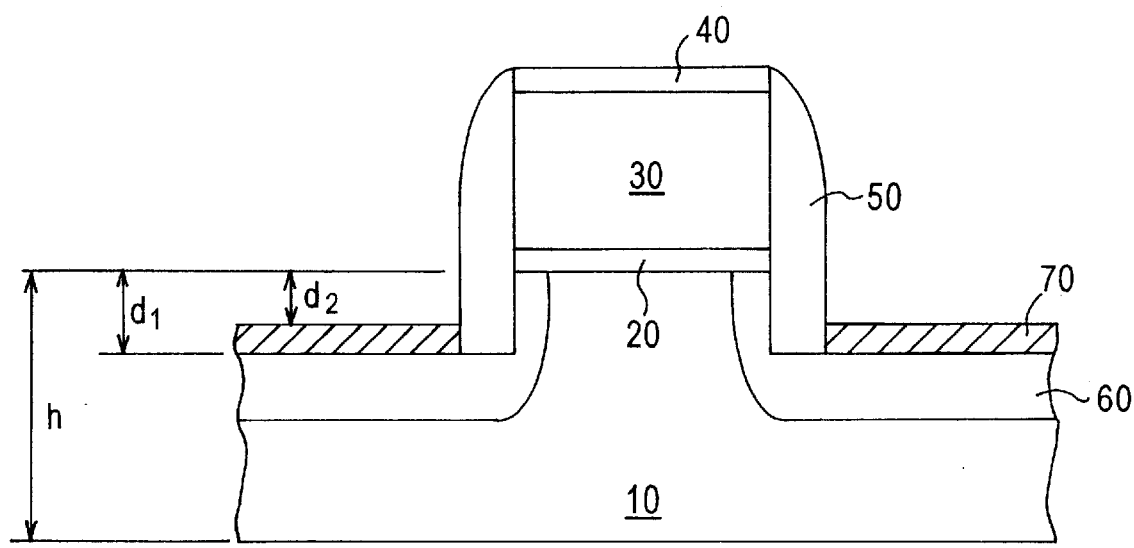
Figure 3:
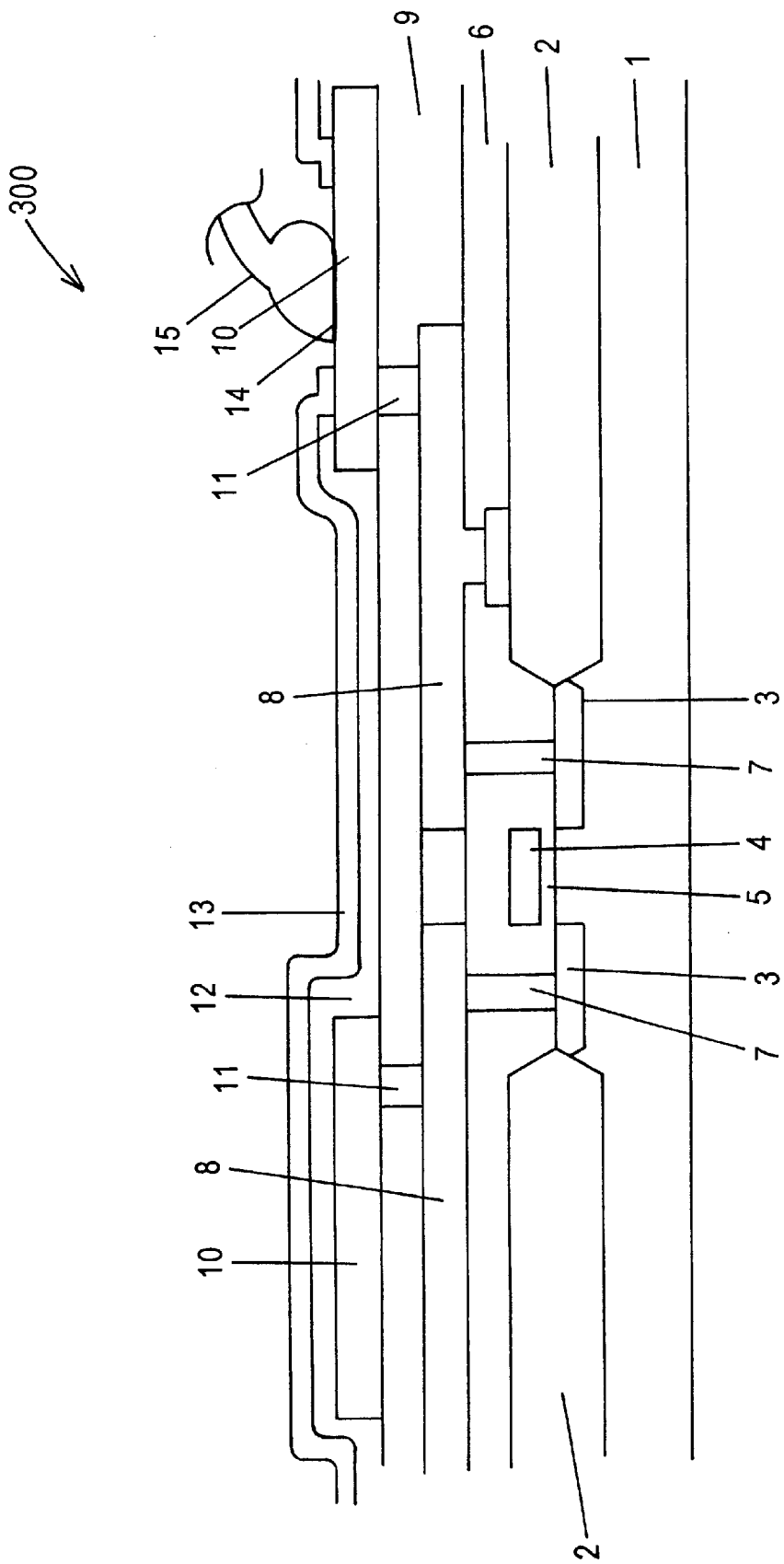
FIG. 3 schematically illustrates the cross-section of a conventional semiconductor device.
Figure 4A:
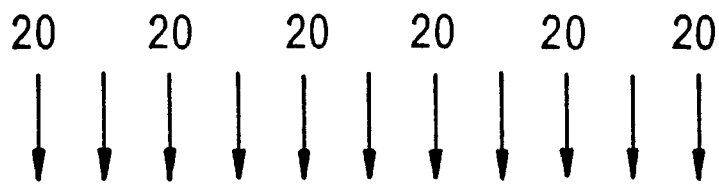
FIGS. 4A and 4B illustrate the formation of a semiconductor device having reduced capacitance, according to conventional methodology.
Figure 4A:
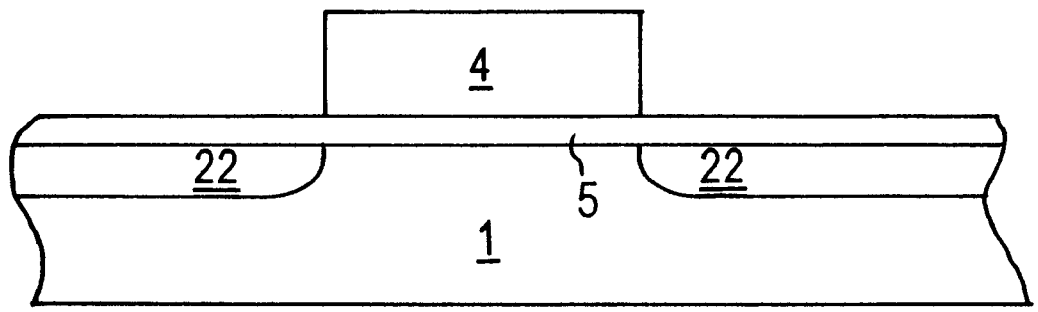
Figure 4B:
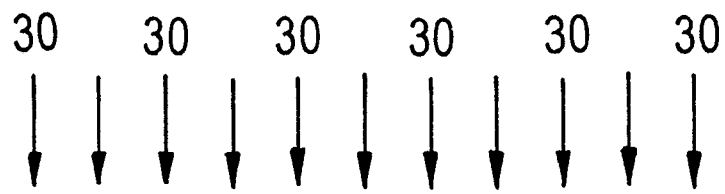
Figure 4B:
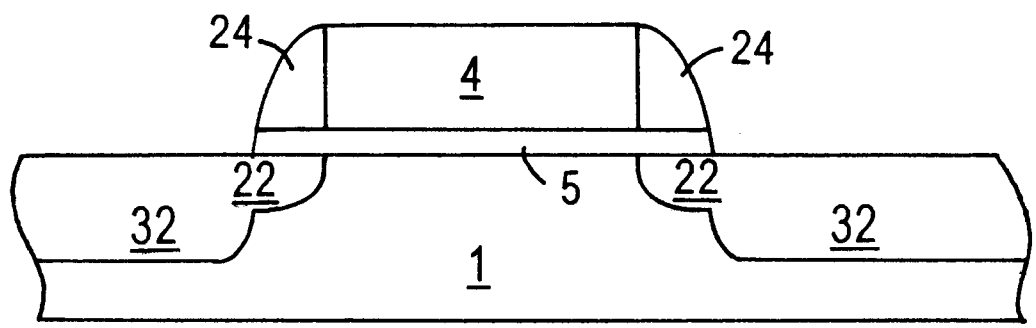

An embodiment of the present invention is schematically illustrated in FIGS. 1–2F, wherein similar features bear similar reference numerals. Referring initially to FIG. 1, a semiconductor device constructed in accordance with the present invention is shown to comprise a semiconductor substrate 10, which can be in the form of monocrystalline silicon. Further, the semiconductor substrate 10 can be doped with either N-type of P-type dopants. A dielectric layer 20 is formed on the semiconductor substrate 10. A gate electrode stack 30 is also formed on top of the dielectric layer 20. The illustration of the dielectric layer 20 and the gate electrode 30 as two separate components is meant to be purely illustrative. It should be recognized that the dielectric layer 20 can also be considered as part of the gate electrode stack 30.

For illustrative convenience, the detailed structure of the gate electrode stack 30 is not illustrated. However, such structures are well known. For example, according to one such conventional structure, a gate electrode stack 30 can comprise a first conductive layer that functions as a floating gate electrode of a non-volatile memory device such as an EEPROM. A second dielectric layer made of a composite comprising silicon oxide on silicon nitride or silicon oxide (ONO) can be formed on the floating gate electrode. Next, a second conductive layer, or control gate is formed on the third dielectric layer.

As illustrated in FIG. 1, an oxide layer 40 can optionally be formed on top of the gate electrode stack 30. FIG. 1 also illustrates sidewall spacers 50 formed on the side surfaces of the gate electrode stack 30. The sidewall spacers 50 can comprise any dielectric material such as, for example, silicon oxide, and can be formed by conventional methods such as oxidation or deposition of a conformal oxide layer followed by an anisotropic etching. The semiconductor substrate 10 includes source/drain regions 60 defined by impurities that have been selectively implanted therein. Such impurities can be P-type such as boron, or N-type such as arsenic. A layer of silicide 70 is subsequently formed over the source and drain regions 60, and adjacent the sidewall spacers 50.

According to the present invention, the source/drain regions 60 are recessed into the semiconductor substrate 10. As illustrated in FIG. 1, the semiconductor substrate 10 has a height h that extends to the original main surface, i.e. up to about dielectric layer 20. The source/ drain regions 60 recessed into the semiconductor substrate 10 by a first depth d1 that is below the height h i.e., the main surface of the semiconductor substrate 10. The first depth d1 is selected to be about of 100 angstroms to about 1,000 angstroms, e.g., about 500 angstroms. Depending on the specific value of the first depth d1, the layer of silicide 70 is formed with its various surface positioned at a second depth d2 below or about the same as the height h.

Semiconductor devices in accordance with embodiments of the present invention are capable of increasing device performance by increasing the distance defined by electric field lines from the side of the gate electrode stack 30 and the silicide layer 70. Contrary to conventional methodologies that increase the thickness of the sidewall spacers 50 in order to achieve an increase in the length of the electric field, the present invention forms the silicide layer 70 at a recessed position in the semiconductor substrate 10 such that the distance defined by the electric field lines is ultimately increased.

FIGS. 2A to 2F schematically illustrate sequential stages in a method of manufacturing a semiconductor device according to an embodiment of the present invention. Referring initially to FIG. 2A, the semiconductor device is shown at a point in the manufacturing process wherein the present invention deviates from conventional methodologies. FIG. 2A illustrates a semiconductor substrate 10 having a height h defined by the distance from its lower surface to its top surface. A dielectric layer 20 is formed on the main surface of the semiconductor substrate 10. A gate electrode stack 30 is subsequently formed on the dielectric layer 20. FIG. 2B also shows an oxide layer 40 formed on gate electrode stack 30.

Referring now to FIG. 2B, source/drain regions 60 are formed by implanting appropriate dopants, or impurities, into the semiconductor substrate 10. The impurities may be implanted to form the source/drain regions 60 using any conventional methods such as, for example, ion implantation or thermal diffusion. If an ion implantation process is utilized, thermal annealing can be performed to activate the impurity implanted regions and restore any damage to the semiconductor substrate 10 as a result of the ion implant process.

The present invention deviates from conventional methodologies in that subsequent to defining the source/drain regions 60, an etching step is performed in the source and drain regions to define recessed source/drain regions 60. As illustrated in FIG. 2c, the recessed source/drain regions 60 extend to a first depth d1 that is beneath the height h of the semiconductor substrate 10. The distance defined by the depth d1 can be about 100 angstroms to about 1,000 angstroms e.g. approximately 500 angstroms. Subsequent to etching to define the recessed source/drain regions 60, dielectric sidewall spacers 50 are formed on the side of the gate electrode stack 30.

As illustrated in FIG. 2D, sidewall spacers 50 extend down into the recessed source/drain regions 60. Next, a refractory layer 80 is conformingly deposited over the source drain regions as well as the sidewall spacers, as illustrated in FIG. 2E. The refractory layer 80 is in the form of a the refractory metal that is deposited on the surface of the structure. The refractory metal is typically selected to be either titanium, tungsten, tantalum, molybdenum, cobalt, and nickel. Next, heating is conducted to meet refractory metal layer 80 with underlying layers of silicon and polysilicon. The heating step yields layers of refractory metal silicide 70 as illustrated in FIG. 2F. The resulting semiconductor device contains source drain regions 60 that are recessed a first depth d1 that is lower than the height h of the main surface of the semiconductor substrate 10. The layer of refractory metal silicide 70 is also recessed a second depth d2 that can be lower than the height h of the semiconductor substrate 10, although such a restriction is not necessary. Specifically, the second depth d2 is partially defined by the value of the first depth d1, and the thickness of the refractory metal silicide layer 70. Accordingly, recessed source and drain regions 60 can be defined such that the top surface of the refractory metal silicide layer 70 is actually higher than the height h of the semiconductor substrate 10.

The present invention advantageously reduces the fringing capacitance between the gate electrode and the source/drain regions. One benefit of such a reduction is the ability to increase circuit speeds while maintaining traditional reliability. The present invention also provides an additional advantage of reducing the thickness of the sidewall spacers without increasing the capacitance between the gate electrode and the source drain regions. Accordingly, the overall size of the semiconductor device can be reduced without comprising real estate.

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well known processing structures have not been described in detail, in order not to unnecessarily obscure the present invention.

The dielectric and conductive layers utilized in manufacturing a semiconductor device in accordance with the present invention can be deposited by conventional deposition techniques. For example, metallization techniques such as various types of chemical vapor deposition (CVD) processes, including low pressure chemical vapor deposition (LPCVD), enhanced chemical vapor deposition (ECVD) and physical vapor deposition (PVD) can be employed.

The present invention enjoys industrial applicability in the manufacturing of semiconductor devices and particularly in semiconductor devices comprising design features of 0.18 micron and under, with increased transistor and circuit speeds. The present invention is applicable to the formation of any of various types of semiconductor devices and, hence, details have not been set forth herein in order to avoid obscuring the thrust of the present invention. In practicing the present invention, conventional photolithographic and etching techniques are employed and, hence, the details of such techniques have not been set forth herein in detail.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a semiconductor device comprising:

forming a gate electrode stack on a main surface of a semiconductor substrate, the gate electrode stack having an upper surface and side surfaces;

forming doped source/drain regions;

etching the main surface of the semiconductor substrate at the formed source drain regions to form doped source/drain regions that are recessed into the semiconductor substrate at a first depth that is lower than a height of the main surface of the semiconductor substrate; and forming a refractory metal silicide layer on the gate electrode stack and the source/drain regions.

2. The method of claim 1, wherein the refractory metal silicide layer is formed at a second depth that is lower than the height of the main surface of the semiconductor substrate.

3. The method of claim 1, wherein the refractory metal silicide layer is formed at a second depth that is higher than or equal to the height of the main surface of the semiconductor substrate.

4. The method of claim 1, further comprising:

forming dielectric sidewall spacers on the side surfaces of the gate electrode stack, prior to the step of forming a refractory metal silicide layer; and wherein the step of forming the refractory metal silicide layer comprises forming a refractory metal layer on the gate electrode stack, the sidewall spacers, and the source/drain regions and heating.

5. The method of claim 1, wherein the step of forming doped areas comprises ion implanting impurities.

6. The method of claim 1, further comprising annealing to activate the implanted impurities regions.

7. The method of claim 1, wherein the step of forming doped areas comprises thermally diffusing impurities into the etched regions of the semiconductor substrate.

8. The method according to claim 1, wherein the first depth is about 100 Å to about 1000 Å lower than the height of the main surface of the semiconductor substrate.

9. The semiconductor device of claim 1, wherein the first depth is about 500 Å lower than the height of the main surface of the semiconductor substrate.

* * * * *

UNITED STATES PATENT AND TRADEMARK OFFICE
CERTIFICATE OF CORRECTION

PATENT NO.     : 6,531,347 B1
DATED          : March 11, 2003
INVENTOR(S)    : Carl R. Huster et al.

It is certified that error appears in the above-identified patent and that said Letters Patent is hereby corrected as shown below:

<u>Title page,</u>
Item [75], Inventors, change the city and state of the first inventor from "Sunnyvale, CA" to -- Camas, WA --.

Signed and Sealed this

Twenty-fourth Day of June, 2003

JAMES E. ROGAN
*Director of the United States Patent and Trademark Office*